US008957498B2

(12) United States Patent
Cheng et al.

(10) Patent No.: US 8,957,498 B2
(45) Date of Patent: Feb. 17, 2015

(54) ON-CHIP ELECTRONIC DEVICE AND METHOD FOR MANUFACTURING THE SAME

(75) Inventors: Yu-Ting Cheng, Hsinchu (TW); Tzu-Yuan Chao, Hsinchu (TW); Kuan-Ming Chen, Hsinchu (TW); Hsin-Fu Hsu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/484,865

(22) Filed: May 31, 2012

(65) Prior Publication Data
US 2012/0235275 A1    Sep. 20, 2012

Related U.S. Application Data

(63) Continuation-in-part of application No. 12/607,433, filed on Oct. 28, 2009, now Pat. No. 8,373,250.

(30) Foreign Application Priority Data

Aug. 21, 2009    (TW) ................................ 98128200 A

(51) Int. Cl.
*H01L 27/08* (2006.01)
*H01L 49/02* (2006.01)
*H01L 23/522* (2006.01)
*H01L 23/532* (2006.01)

(52) U.S. Cl.
CPC ............ *H01L 28/10* (2013.01); *H01L 23/5227* (2013.01); *H01L 23/5329* (2013.01)
USPC ............. 257/531; 257/E29.323; 257/E29.022

(58) Field of Classification Search
USPC ........................... 257/531, E29.323, E21.022
See application file for complete search history.

(56) References Cited

U.S. PATENT DOCUMENTS

| 7,750,413 | B2 | 7/2010 | Hayashi et al. |
| 8,044,755 | B2 * | 10/2011 | Smeys et al. .................. 336/200 |
| 2009/0278240 | A1 | 11/2009 | Kaneko et al. |

OTHER PUBLICATIONS

Tzu-Yuan Chao, H.F. Hsu, K.M. Chen, and Y.T. Cheng; NiFe-AAO Nanocomposite for Performance Enhancement of On-Chip Spiral Inductors; IEEE Transducers '11, Beijing, China,Jun. 5-9, 2011, pp. 2686-2689.

* cited by examiner

*Primary Examiner* — Zandra Smith
*Assistant Examiner* — Paul Patton
(74) *Attorney, Agent, or Firm* — Rosenberg, Klein & Lee

(57) ABSTRACT

The present invention relates to an on-chip electronic device and a method for manufacturing the same. The on-chip electronic device according to the present invention comprises a substrate, a porous layer, a plurality of magnetic bodies, and an electronic member layer. The porous layer is disposed on the substrate and has a plurality of voids; each of the plurality of magnetic bodies is disposed in the plurality of voids, respectively; and the electronic member layer is disposed on one side of the porous layer, such as upper side of or lower sider of the porous layer. Because the plurality of magnetic bodies is used as the core of the inductance, the inductance is increased effectively and the area of the on-chip electronic device is reduced. Besides the manufacturing method according to the present invention is simple and compatible with the current CMOS process, the manufacturing cost can be lowered.

11 Claims, 15 Drawing Sheets

ON-CHIP ELECTRONIC DEVICE AND METHOD FOR MANUFACTURING THE SAME

REFERENCE TO RELATED APPLICATION

This Application is being filed as a Continuation-in-Part of patent application Ser. No. 12/607,433, filed 28 Oct. 2009, currently pending.

FIELD OF THE INVENTION

The present invention relates to a chip structure, and particularly to an on-chip electronic device and a method for manufacturing the same.

BACKGROUND OF THE INVENTION

With the progress of modern technologies, the coming of information era, and the prosperous development of network, various electronic products are developed for satisfying people's demand. The functions of the electronic products are becoming powerful and complete increasingly, and thus bringing convenience for people's lives. All of the current electronic products pursue miniaturization and are fastidious about lightness and thinness. Under high-density packaging, the size of the required electronic devices is becoming relatively smaller, particularly for radio-frequency integrated circuits (RFICs) applied in portable wireless communication electronic products.

Currently, for increasingly demanded RFICs, the most urgent need is not on enhancing the efficiency of active devices but on improving the characteristics of passive devices such as resistors, capacitors, and inductors. For modern semiconductor process technologies, it is not a problem to provide superior resistors and capacitors that are easy to be implemented and simulated. However, for passive inductors, the only choice is spiral inductors. The inductance of spiral inductors depends strongly on the semiconductor process adopted to fabricate them. The method for increasing the inductance of an on-chip inductor is mostly to increase the number of turns of the inductor, which will increase the occupied area, and hence is unfavorable for miniaturization of the on-chip inductor. Thereby, how to increase effectively the inductance is still a major issue for developing the on-chip inductor. In addition, the Q factor (quality factor) of the inductor will also reduce owing to substrate loss.

Accordingly, the present invention provides an on-chip electronic device and a method for manufacturing the same for solving the problems described above. According to the present invention, the drawbacks according to the prior art as described above can be improved; the inductance can be increased; the area can be reduced; and the manufacturing cost can be lowered.

SUMMARY

An objective of the present invention is to provide an on-chip electronic device and a method for manufacturing the same, which uses a plurality of magnetic bodies disposed in a plurality of voids in a porous layer as the core of the magnetic inductance for increasing inductance efficiency and reducing occupied area.

Another objective of the present invention is to provide an on-chip electronic device and a method for manufacturing the same, which has a simple structure with a manufacturing method compatible with the CMOS process, and hence reducing the cost.

Still another objective of the present invention is to provide an on-chip electronic device and a method for manufacturing the same, which has a high-intensity anisotropy magnetic field, and hence the magnetic resonance (MR) frequency is increased.

The on-chip electronic device according to the present invention comprises a substrate, a porous layer, a plurality of magnetic bodies, and an electronic member layer. The manufacturing method according to the present invention comprises providing the substrate, forming the porous layer with a plurality of voids on the substrate, forming the plurality of magnetic bodies in the plurality of voids, and forming the electronic member layer on the porous layer. Because the plurality of magnetic bodies is used as the core of the magnetic inductance, the inductance efficiency of the on-chip electronic device is increased effectively while the occupied area is reduced effectively. Besides, because the manufacturing method according to the present invention is compatible with the current CMOS process, the manufacturing cost can be lowered.

The manufacturing method according to the present invention further comprises providing the substrate, forming a electronic member layer on the substrate, forming a porous layer with a plurality of voids on the electronic member layer, and forming a plurality of magnetic bodies in the plurality of voids. Because the plurality of magnetic bodies is used as the core of the inductance efficiency, the inductance efficiency of the on-chip electronic device is increased effectively while the occupied area is reduced effectively.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
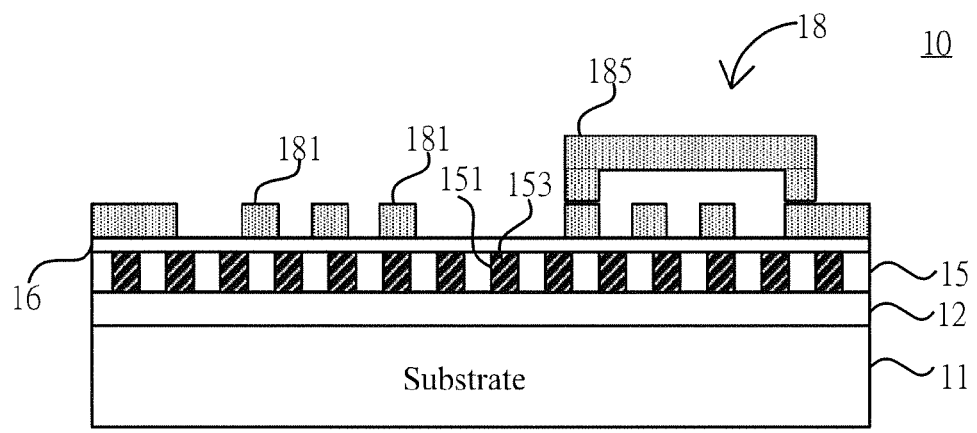
FIG. 1 shows a structure of the on-chip electronic device according to a preferred embodiment of the present invention.

FIG. 1 shows a structure of the on-chip electronic device according to a preferred embodiment of the present invention. As shown in the figure, the on-chip electronic device 10 according to the present invention is an inductor, which comprises a substrate 11, a porous layer 15, a plurality of magnetic bodies 153, and electronic member layer 18. The porous layer 15 is disposed on the substrate 11 and has a plurality of voids 151 thereon. The plurality of magnetic bodies 153 is disposed in the plurality of voids 151. A preferred embodiment of the porous layer 15 of the on-chip electronic device according to the present invention is a nanometer porous layer. The material of the magnetic bodies 153 can be any conductive material, such as ferromagnetic material, including nickel. The porous layer 15 according to the present invention is a nonconductor. A preferred embodiment of the porous layer 15 is, but not limited to, an aluminum oxide layer.

Figure 2:
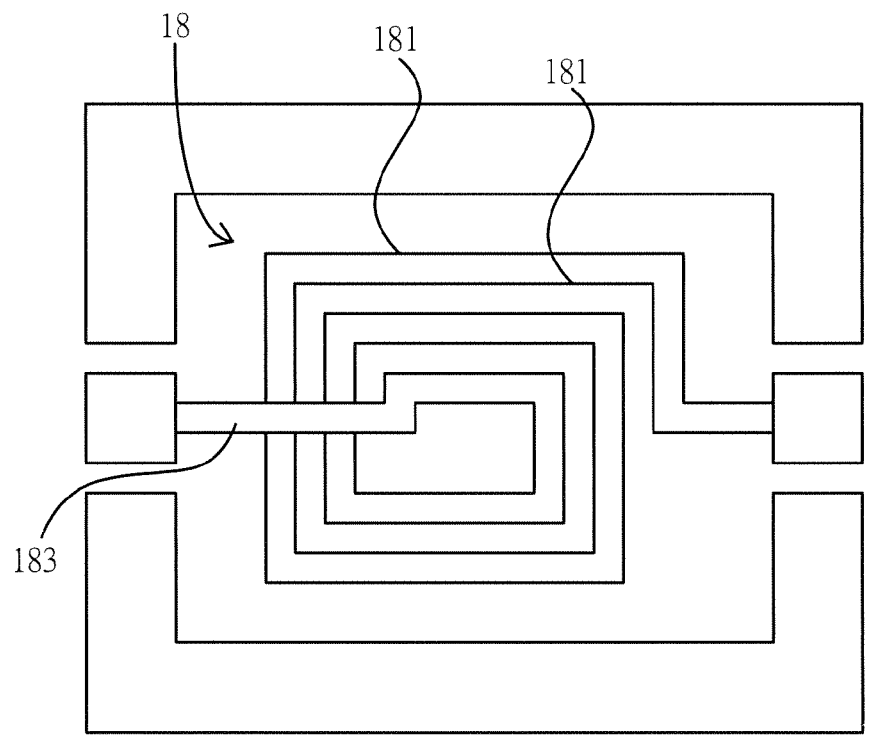
FIG. 2 shows a top view of the on-chip electronic device according to a preferred embodiment of the present invention.

Because the porous layer 15 according to the present invention is nonconductive and voids 151 do not communicate with each other, the magnetic bodies 153 are isolated electrically from each other. A preferred embodiment of the conductor 153 according to the present invention is pillar shaped. The depth-to-width ratio according to an embodiment of the conductor 153 is greater than 3:1. The geometry of the conductor 153 can be determined according to the thickness of the porous layer 15 and the diameter of the voids 151. The electronic member layer 18 is disposed on the porous layer 15. An embodiment of the electronic member layer 18 according to the present invention is an inductor member layer, such as a spiral inductor, which comprises a plurality of coils 181 and an interconnection wire 185. As shown in FIG. 2, the interconnection wire 185 is a crossover wire used for connecting to the innermost coil 181 of the electronic member layer 18 and crossing over other coils 181. According to an embodiment of the present invention, the shape of the electronic member layer 18 can be any geometrical shape, for example, a rectangle, an octagon, or a circle. The on-chip electronic device according to the present invention further comprises a first insulation layer 12 disposed on the substrate 11 and between the substrate 11 and the porous layer 15 for isolating electrically the substrate 11 and the porous layer 15, and a second insulation layer 16 disposed between the porous layer 15 and the electronic member layer 18.

According to the present invention, the porous layer 15 is disposed, and the plurality of magnetic bodies 153 is disposed in the plurality of voids 151 of the porous layer 15 to form a composite material as the core. Thereby, the inductance of the electronic member layer 18 is increased effectively. In comparison with the on-chip inductor according to the prior art, the on-chip electronic device performed as inductor according to the present invention can reduced effectively the occupied chip area by the electronic member layer, and this achieving the objective of miniaturization. Additionally, the on-chip electronic device performed as inductor according to the present invention has a simple structure, and hence lowering the production cost.

Figure 3A:
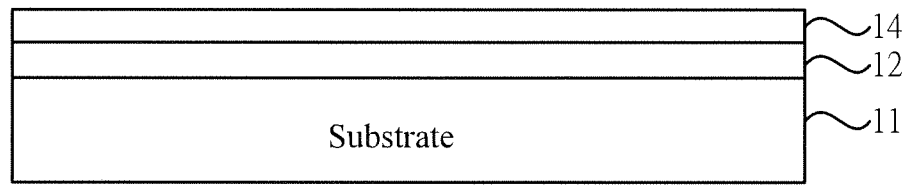
FIG. 3A to FIG. 3H show structural schematic diagrams of the manufacturing process for the on-chip electronic device according to a preferred embodiment of the present invention.
Figure 3B:
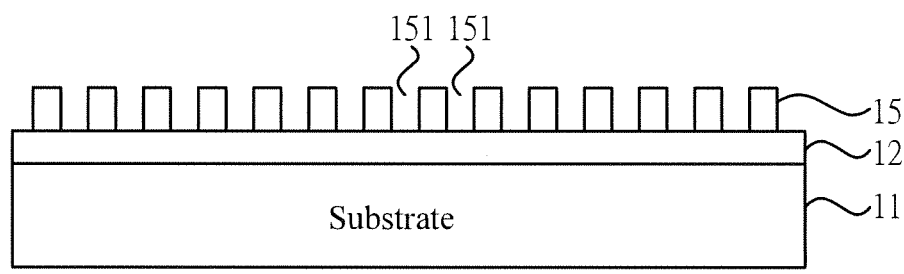
Figure 3C:
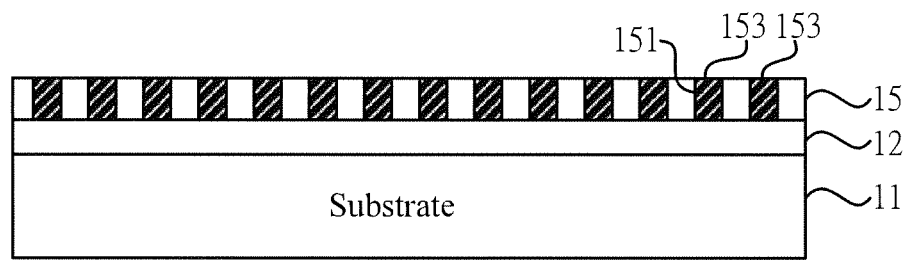

FIG. 3A to FIG. 3H show structural schematic diagrams of the manufacturing process for the on-chip electronic device 10 according to a preferred embodiment of the present invention. First, as shown in FIG. 3A, the substrate 11 is provided and the first insulation layer 12 and the nonconductive layer 14 are formed on the substrate 11, and the nonconductive layer 14 is used for forming voids 151 in the nonconductive layer 14 and thus forming the porous layer 15 as shown in FIG. 3B. In addition, before the step of forming the porous layer 15, the first insulation layer 12 is firstly formed on the substrate 11 for isolating electrically the substrate 11 from the porous layer 15. Next, as shown in FIG. 3B, the voids 151 are formed in the nonconductive layer 14 for forming the porous layer 15. A preferred embodiment of the nonconductive layer 14 as described above is an aluminum oxide layer. Then, as shown in FIG. 3C, the magnetic bodies 153 are formed in the voids 151 for forming a composite material as the core. Afterwards, the subsequent step of forming the electronic member layer 18 on the porous layer 15 can be performed.

In the step of forming the nonconductive layer 14 described above, an aluminum layer is formed first. Then, oxidizing the aluminum layer forms the aluminum oxide layer, namely, the nonconductive layer 14. The above-mentioned method of forming the aluminum oxide layer as the nonconductive layer 14 is only an embodiment of the present invention. According to the present invention, evaporation deposition can be used for forming an aluminum layer on the substrate 11. Then the anodizing process can be used to oxide the aluminum layer for forming the nonconductive layer 14. A method for fabricating the porous layer 15 according to the present invention is performing the anodizing process in various acid solutions on the aluminum layer. In the process, different specific parameters, such as applied voltage, current, temperature, and time, are controlled. These parameters have great correlation on the diameters and length of the plurality of voids 151. An embodiment of the present invention is to put the aluminum layer in a 0.3 M oxalic acid ($H_2C_2O_4$) solution and apply 40 volts to the aluminum layer at room temperature until the aluminum layer is oxidized completely. Then the aluminum oxide layer is formed as the nonconductive layer 14.

After the aluminum layer is oxidized completely, the aluminum oxide layer is annealed at 400° C. for two hours for reinforcing its structure. Then, dispose the annealed nonconductive layer 14 in a 5% phosphoric acid ($H_3PO_4$) solution at 30° C. for 50 minutes for forming uniformly distributed nanometer voids 151. The diameter of the plurality of voids 151 is 70 nm. Thereby, the porous layer 15 is formed. Next, form the magnetic bodies 153 in the plurality of voids 151. According to an embodiment of the present invention, immerse the porous layer 15 in tin chloride ($SnCl_2$) solution for two minutes and palladium chloride ($PdCl_2$) solution for 30 seconds, respectively, for activating the surface of the porous layer 15. Subsequently, electroplate nickel to the porous layer 15 at 60° C. for one minute for forming the magnetic bodies 153 in the porous layer 15. The electroplating described above can be electroless plating. Afterwards, polish the surface of the porous layer 15 for removing nickel thereon for isolating electrically the magnetic bodies 153 (nickel) in the plurality of voids 151 of the porous layer 15, and thus reducing eddy current loss. Moreover, rapid thermal annealing can be further performed at 400° C. for two minutes for improving magnetic characteristics of the magnetic bodies 153.

The method described above is only an embodiment of the present invention, not used for limiting the method for forming the porous layer 15. Beside, the material of the magnetic bodies 153 is not limited to nickel. Any other ferromagnetic material can be used as well. By using the porous layer 15 and the magnetic bodies 153 as the core, the strength of anisotropy magnetic field is high, and the material of the magnetic bodies 153 are made of a ferromagnetic material. Thus, the ferromagnetic resonance (FMR) frequency is increased.

Figure 3D:
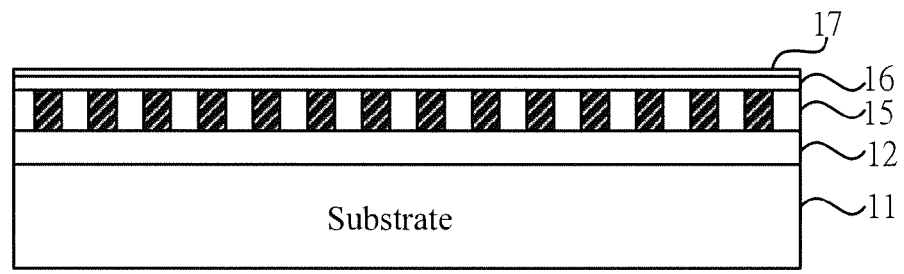
Figure 3E:
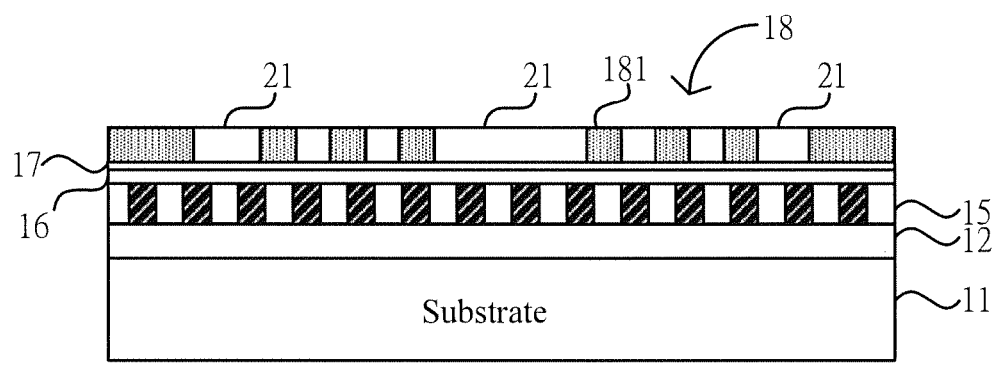

After the porous layer 15 is completed, the process of forming the electronic member layer 18 can be performed subsequently. As shown in FIG. 3D, before forming the electronic member layer 18, the second insulation layer 16 is firstly formed on the porous layer 15 and between the porous layer 15 and the electronic member layer 18 for isolating electrically the porous layer 15 from the electronic member layer 18. According to the present invention, a method for forming the electronic member layer 18 is electroplating as described in detail as follows. Referring to FIG. 3D, a first seed layer 17 is formed first on the second insulation layer 16. Next, as shown in FIG. 3E, form a first photoresist layer 21 on the first seed layer 17 according to the desired pattern of the coils 181 of the electronic member layer 18 for masking part of the first send layer 17. Then, a first metal layer is formed on the part of the first seed layers 17 not masked by the first photoresist layer 21. That is to say, the plurality of coils 181 of the electronic member layer 18 is formed on the first seed layer 17.

Figure 3F:
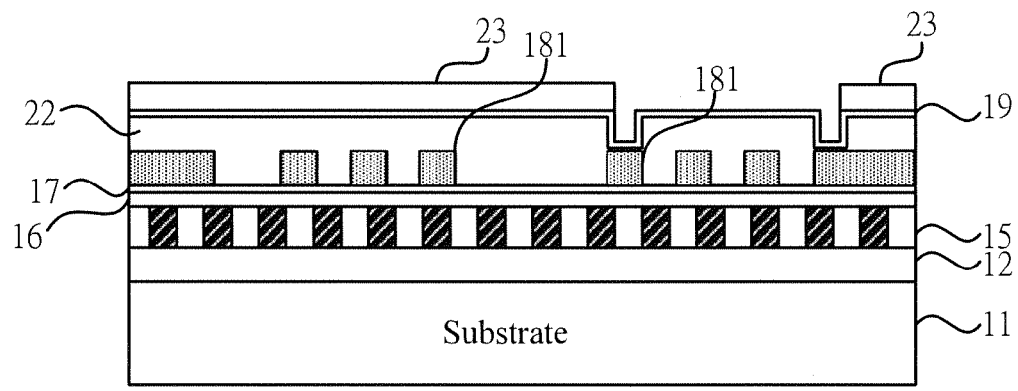
Figure 3G:
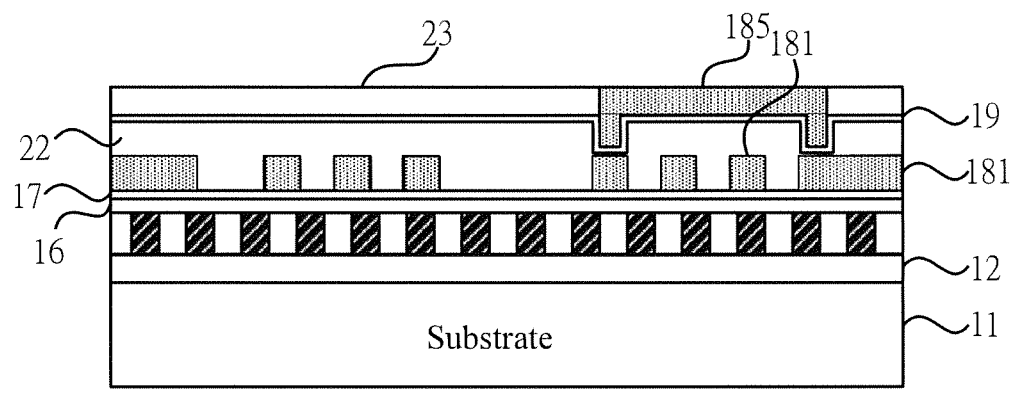
Figure 3H:
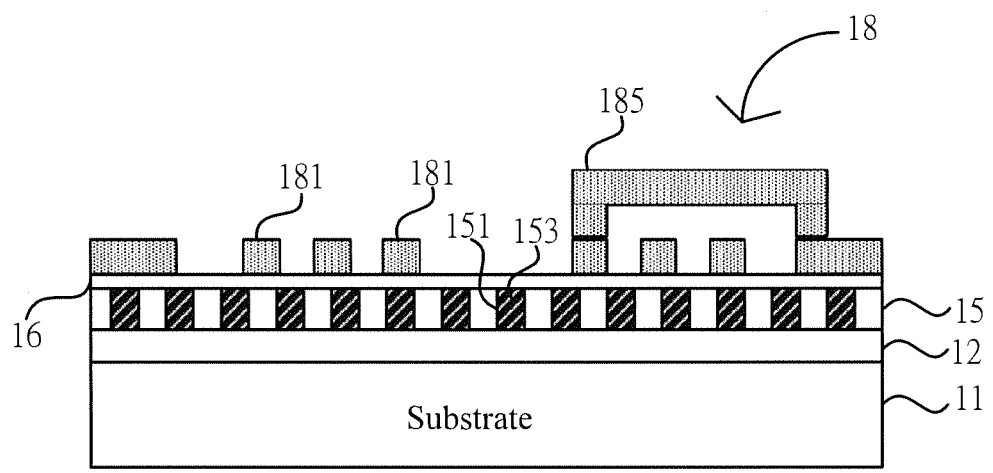

Next, as shown in FIG. 3F, remove the first photoresist layer 21 and form a second photoresist layer 22 on the first metal layer for masking the first metal layer, namely, the masking the coils 181. The pattern of the second photoresist layer 22 is bridge shaped for subsequently forming the interconnection wire 185, namely, forming the crossover of the electronic member layer 18 used for connecting to the innermost coil 181 of the electronic member layer 18 and crossing over the rest of the coils 181. Then, form a second seed layer 19 on the second photoresist layer 22 and form a third photoresist layer 23 on the second seed layer 19. However, the third photoresist 23 does not mask completely the second seed layer 19. Afterwards, referring to FIG. 3G, form a second metal layer on the second seed layer 19 not masked by the third photoresist layer 23 for forming the interconnection wire 185. Finally, referring to FIG. 3H, remove the second and third photoresist layers 22, 23, and the on-chip electronic device as shown in FIG. 1 is thereby completed. The materials of the first and second metal layers described above include copper. In other words, the materials of the coils of the electronic member layer 18 and of the interconnection wire 185 can be, but not limited to, copper. Additionally, the materials of the first and second seed layers 17, 19 include copper as well. Moreover, the material of the first seed layer 17 further includes titanium.

Furthermore, the magnetic bodies 153 of the on-chip electronic device 10 are made of a non-conductive material, such as ceramic material, so the first and second insulation layers 12, 16 are not required. Therefore, the porous layer 15 having the magnetic bodies 153 is directly disposed on the substrate 11, and the electronic member layer 18 is directly disposed on the porous layer 15. On the other hand, the on-chip electronic device 10 is thinner without the first and second insulation layers 12, 16 while the magnetic bodies 153 are made of the non-conductive material.

Because the porous layer 15 is disposed on the substrate 11 and the magnetic bodies 153 are disposed in the voids 151 of the porous layer 15 for forming a composite material as the core, the inductance can be increased effectively while reducing the area occupied by the electronic member layer 18 effectively for achieving the required inductance. In addition, because the process according to the present invention is simple and compatible with the current CMOS process, while performing the CMOS process according to the prior art, the on-chip electronic device according to the present invention can be manufactured simultaneously. Thereby, no special equipment is needed and hence the cost can be lowered. Besides, the present invention is suitable for on-chip inductors of any geometrical shapes without limitations. According to the present invention, by increasing the distribution density of the voids 151 of the porous layer 15, the inductance of the electronic member layer 18 can be increased. Furthermore, according to the present invention, because the magnetic bodies 153 are used as the core of the electronic member layer 18, the FMR frequency can be increased and hence the influence of ferromagnetic resonance can be eliminated. Consequently, the Q performance of the electronic member layer 18 is maintained.

Figure 4:
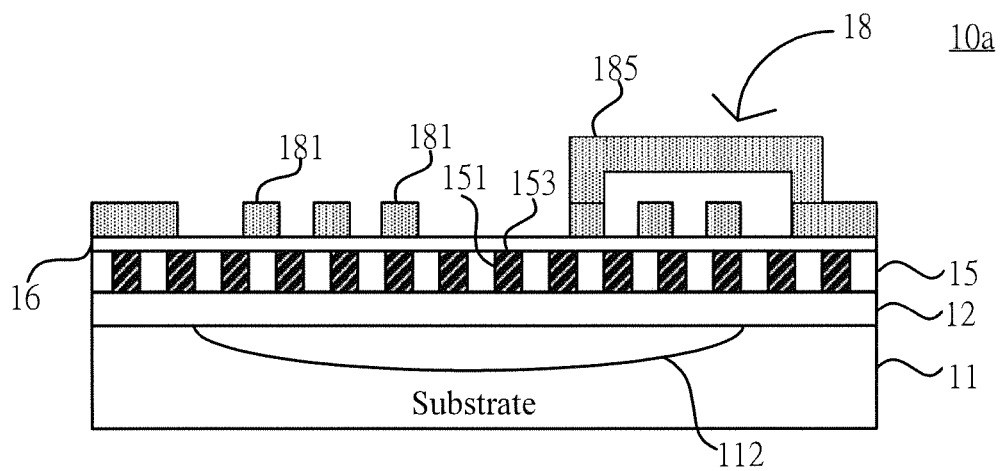
FIG. 4 shows a structure of the on-chip electronic device according to another preferred embodiment of the present invention.

FIG. 4 shows a structure of the on-chip electronic device according to another preferred embodiment of the present invention. Being similar to FIG. 1, the on-chip electronic device 10a according to this embodiment is also an inductor, so the on-chip electronic device 10a also includes the substrate 11, the first insulating layer 12, the porous layer 15, the plurality of magnetic bodies 153, the second insulating layer 16, and the electronic member layer 18. The porous layer 15 is also disposed on the substrate 11 and also has the plurality of voids 151 thereon. The plurality of magnetic bodies 153 is also disposed in the plurality of voids 151. Further, the on-chip electronic device 10a includes a chamber 112 disposed in the substrate 11 for increasing the resonance characteristic of the inductance.

Figure 5A:
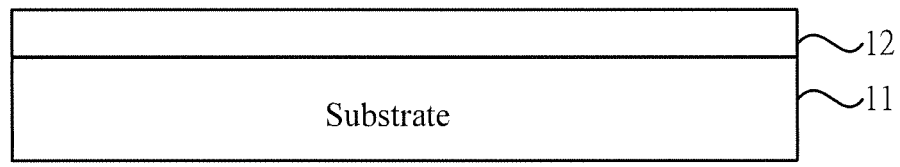
FIG. 5A to FIG. 5J show structural schematic diagrams of the manufacturing process for the on-chip electronic device according to another preferred embodiment of the present invention.
Figure 5B:
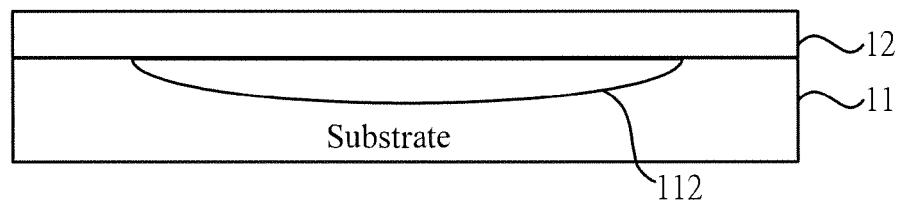
Figure 5C:
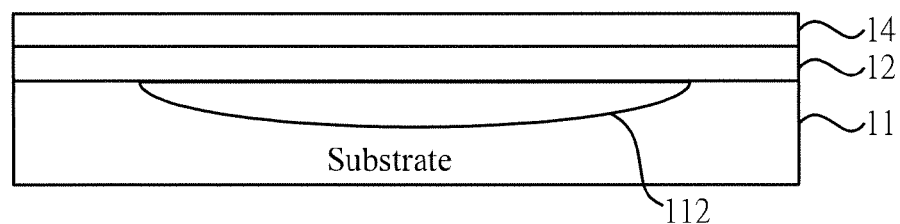
Figure 5D:
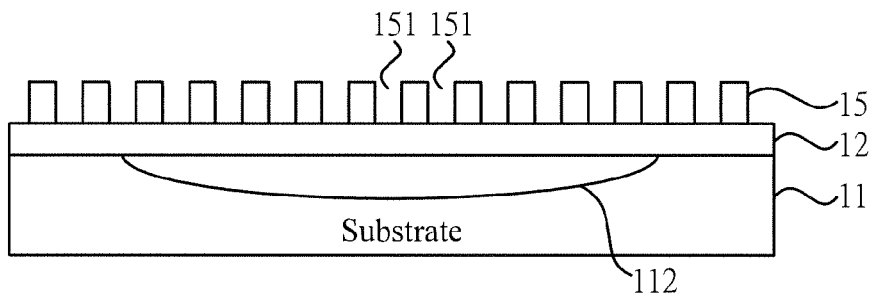
Figure 5E:
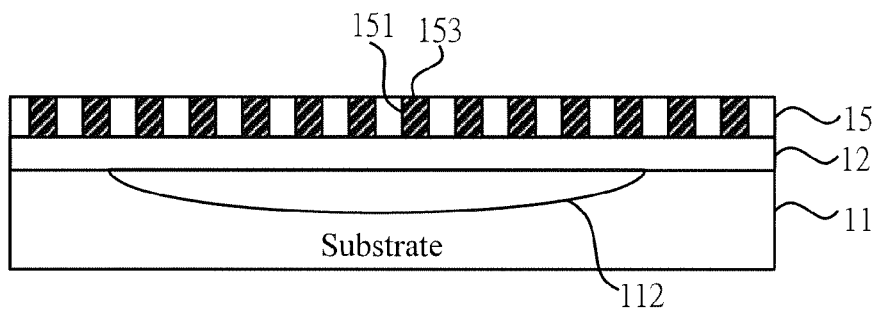
Figure 5F:
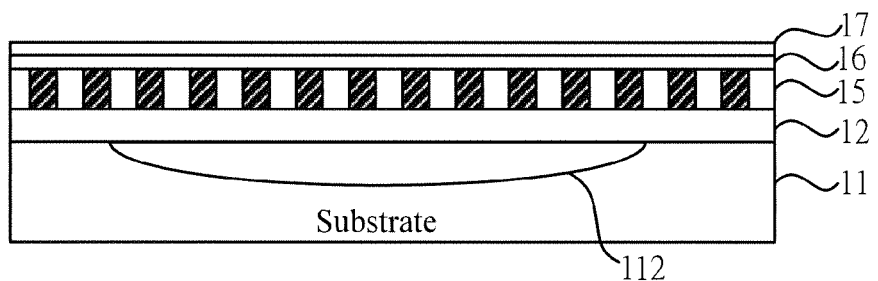
Figure 5G:
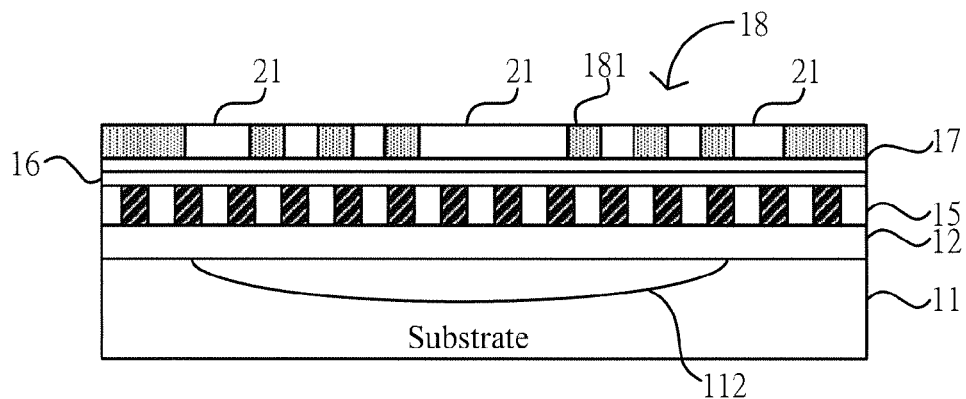
Figure 5H:
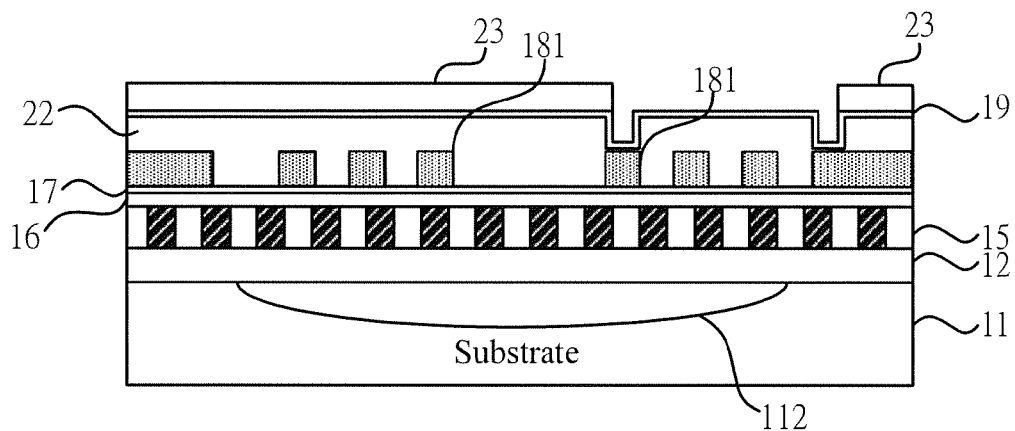
Figure 5I:
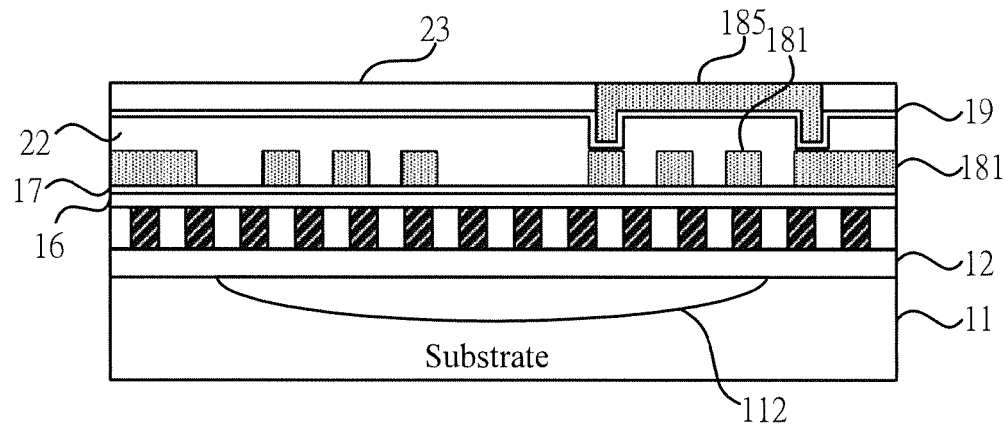
Figure 5J:
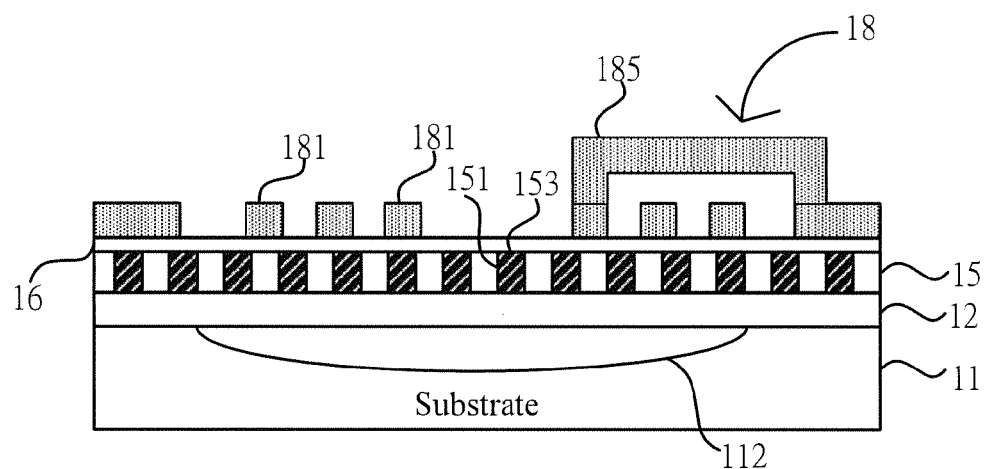

FIG. 5A to FIG. 5J show structural schematic diagrams of the manufacturing process for the on-chip electronic device 10a according to another preferred embodiment of the present invention. Compared with FIGS. 3A-3H, FIGS. 5A-5J further shows the step of forming the chamber 111 in the substrate 11, as shown in the FIG. 5B. According to the manufacturing process from FIG. 5A to FIG. 5J, the first insulation layer 12 disposed on the substrate 11 is provided, and then the chamber 112 is formed in the substrate 11 by using an etching manner, such as side etching. FIG. 5C shows the non-conductive material 14 is formed on the first insulation layer 12, and FIGS. 5D-5J are the same as FIGS. 3B-3H, so other steps of FIGS. 5D-5J are operated the same way as FIGS. 3B-3H.

Figure 6:
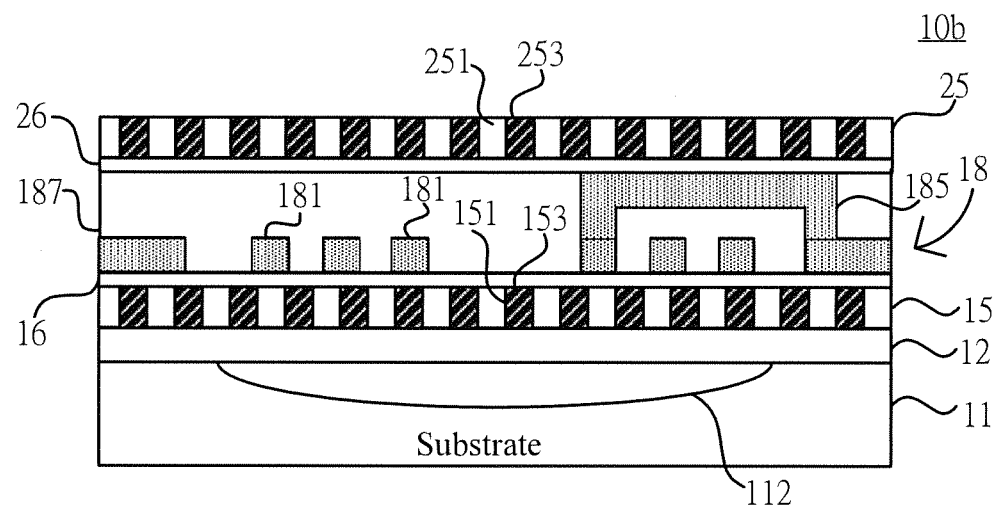
FIG. 6 shows a structure of the on-chip electronic device according to another preferred embodiment of the present invention.

FIG. 6 shows a structure of the on-chip electronic device according to another preferred embodiment of the present invention. Being similar to FIG. 4, the on-chip electronic device 10b according to this embodiment is also an inductor, so the on-chip electronic device 10b also includes the substrate 11, the first insulating layer 12, the porous layer 15, the plurality of magnetic bodies 153, the second insulating layer 16, and the electronic member layer 18. The porous layer 15 is also disposed on the substrate 11 and also has a plurality of voids 151 thereon. The plurality of magnetic bodies 153 is also disposed in the plurality of voids 151. Further, the on-chip electronic device 10b includes a porous layer 25 and an insulating layer 26. The insulating layer 26 is disposed on the electronic member layer 18 having a coil spacer layer 187 which is covered with the coils 181 and the wire 185, and the porous layer 25 is disposed on the insulating layer 26. On the other hand, the porous layer 15, the electronic member layer 18 and the porous layer 25 are formed as a sandwiched structure. The porous layer 25 has a plurality of voids 251 thereon, and a plurality of magnetic bodies 253 is disposed in the plurality of voids 251.

Figure 7:
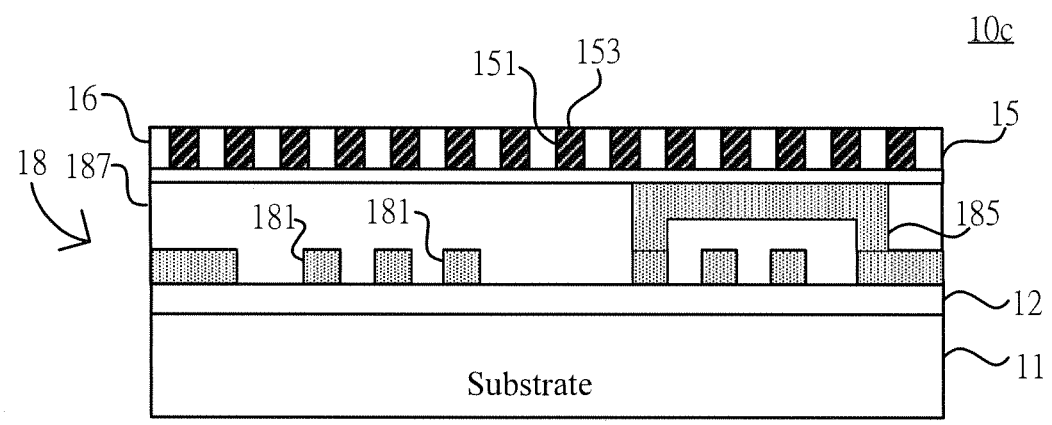
FIG. 7 shows a structure of the on-chip electronic device according to another preferred embodiment of the present invention.

FIG. 7 shows a structure of the on-chip electronic device according to another preferred embodiment of the present invention. Being similar to FIG. 6, the on-chip electronic device 10c according to this embodiment is also an inductor, so the on-chip electronic device 10c also includes the substrate 11, the first insulating layer 12, the porous layer 15, the plurality of magnetic bodies 153, the second insulating layer 16, and the electronic member layer 18. However, the electronic member layer 18 is not disposed on the porous layer 15, and the porous layer 15 having the plurality of voids 151 thereon according to this embodiment is not disposed on the substrate 11. The electronic member layer 18 is disposed on the substrate 11, and the porous layer 15 is disposed on the electronic member layer 18 having the coil spacer layer 187 covered with the coils 181 and the wire 185. The plurality of magnetic bodies 153 is disposed in the plurality of voids 151. Further, the first insulating layer 12 is disposed between the substrate 11 and the electronic member layer 18, and the second insulating layer 16 is disposed between the electronic member layer 18 and the porous layer 15.

Figure 8:
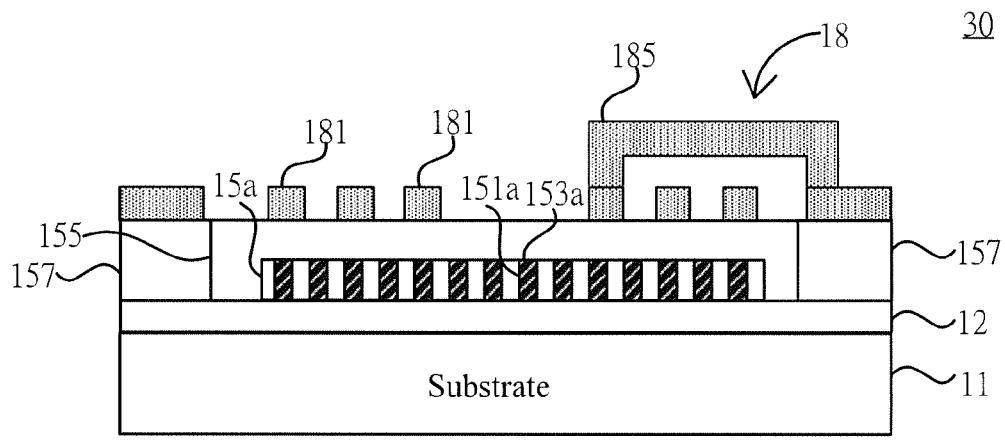
FIG. 8 shows a structure of the on-chip electronic device according to another preferred embodiment of the present invention.

FIG. 8 shows a structure of the on-chip electronic device according to another preferred embodiment of the present invention. The on-chip electronic device 30 shown in FIG. 8 is a resonator, and the on-chip electronic device 30 is similar to the on-chip electronic device 10c. Therefore, the on-chip electronic device 30 also comprises the substrate 11, the first insulating layer 12, the second insulating layer 16, and the electronic member layer 18, the on-chip electronic device 30 further has a porous layer 15a and a plurality of magnetic bodies 153a, wherein the porous layer 15a is disposed on the substrate 11, and the first insulating layer 12 is disposed between the substrate 11 and the porous layer 15a. The porous layer 15a also has a plurality of voids 151a, and the plurality of magnetic bodies 153a is also disposed in the voids. The porous layer 15a according to this embodiment is shorter than the substrate 11, and shorter than the first insulating layer 12.

Further, a spacer layer 157 is located on the first insulating layer 12 and disposed around the porous layer 15a. The electronic member layer 18 is disposed on the porous layer 15a, and further disposed on the spacer layer 157. The metal layer 18 also has the coils 181 and the wire 185, and the wire 185 is also used to connect with the innermost coil 181 and other coils 181. It is noted that a chamber 155 is disposed between the porous layer 15a and the electronic member layer 18. Accordingly, the on-chip electronic device 30 provides the resonator characteristics due to that the porous layer 15a, the chamber 155 and the electronic member layer 18 is formed as a resonant structure.

Figure 9A:
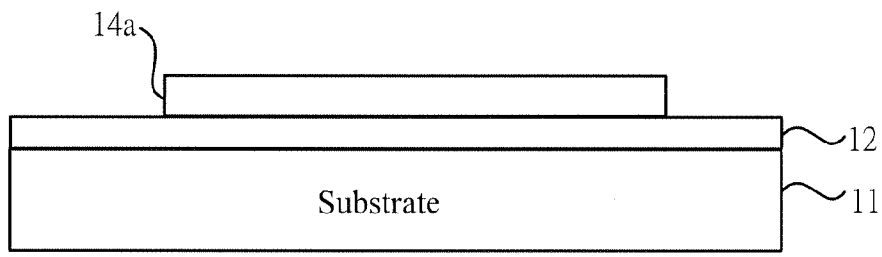
FIG. 9A to FIG. 9I show structural schematic diagrams of the manufacturing process for the on-chip electronic device according to another preferred embodiment of the present invention.
Figure 9B:
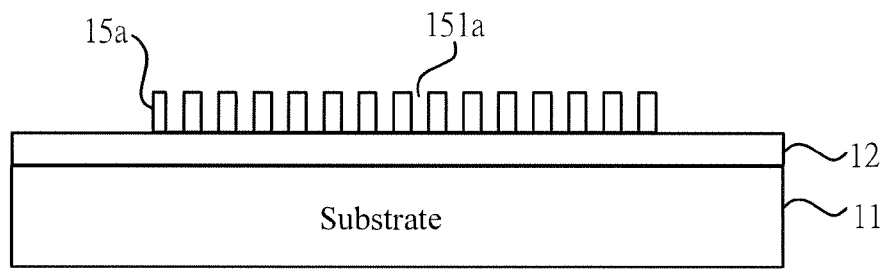
Figure 9C:
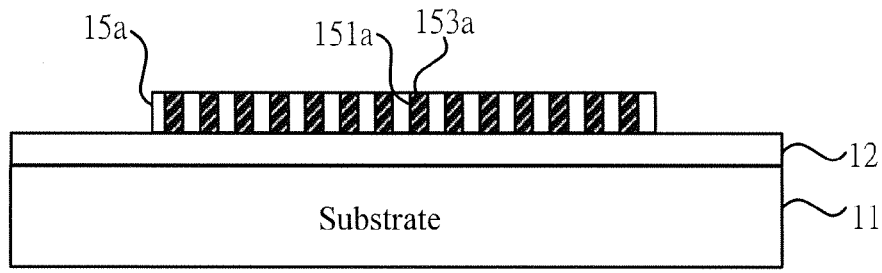

FIG. 9A to FIG. 9I show structural schematic diagrams of the manufacturing process for the on-chip electronic device according to another preferred embodiment of the present invention. Firstly, as shown in FIG. 9A, the substrate 11 is provided and the first insulation layer 12 and the non-conductive layer 14 are formed on the substrate 11, and the nonconductive layer 14 is used for forming voids 151a in the non-conductive layer 14 and thus disposing the porous layer 15a on the first insulating layer 12 as shown in FIG. 9B. A preferred embodiment of the nonconductive layer 14 as described above is an aluminum oxide layer. It is noted that the non-conductive layer 14 is shorter than the substrate 11 and the first insulating layer 12, so the porous layer 15a occupies part of upper surface of the first insulating layer 12. Then, as shown in FIG. 9C, the magnetic bodies 153a are formed in the voids 151a for forming a composite material as the filled core of the voids 151a.

Figure 9D:
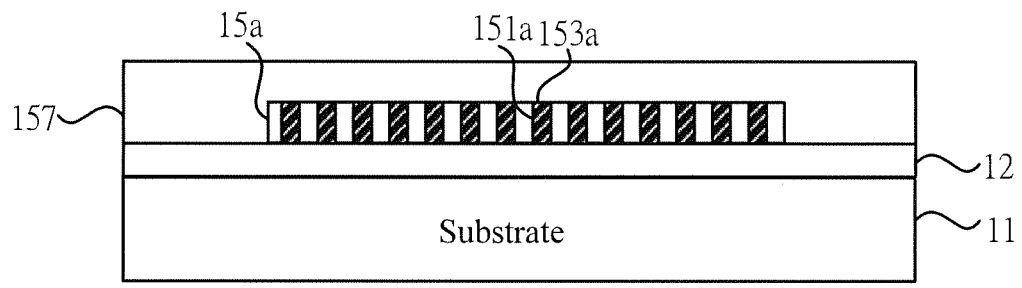
Figure 9E:
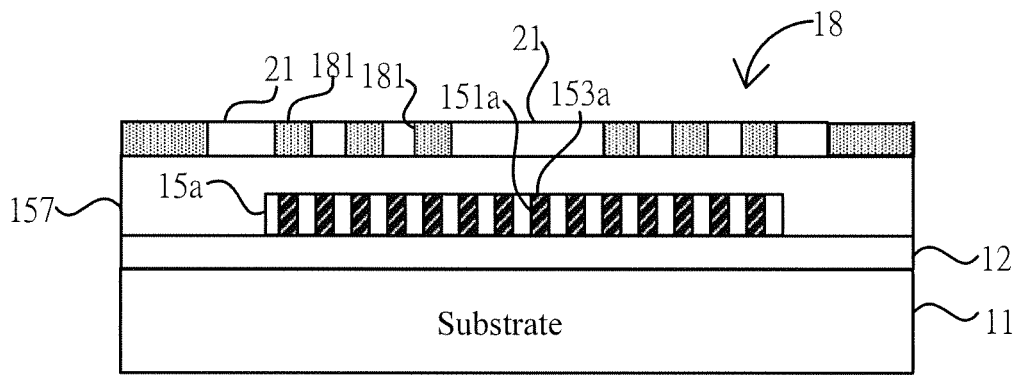
Figure 9F:
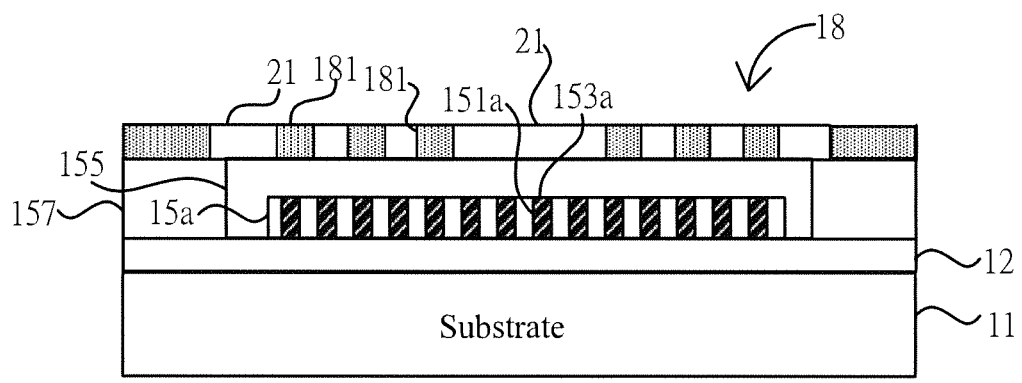

As shown in FIG. 9D, the spacer layer 157 is formed on the porous layer 15a and the first insulating layer 12. That is, the spacer layer 157 covers the porous layer 15a and the first insulating layer 12. Next, as shown in FIG. 9E, a first photoresist layer 21 is formed on the spacer layer 157 according to the desired pattern of the coils 181 of the electronic member layer 18 for masking part of the spacer layer 157. Thereby, the electronic member layer 18 is disposed on the spacer layer 157, so the electronic member layer 18 is also disposed on the porous layer 15a. Then, as shown in FIG. 9F, the chamber 155 is formed between the porous layer 15a and the electronic member layer 18. On the other hand, the chamber 155 is formed in the spacer layer 157.

Figure 9G:
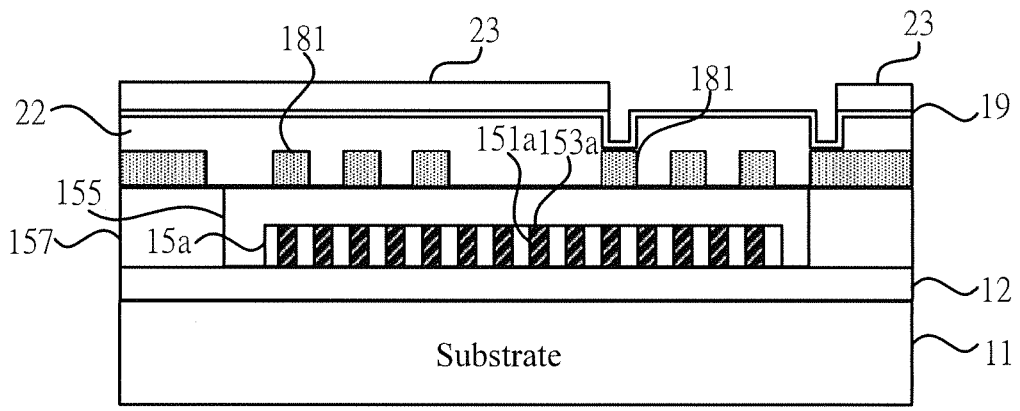
Figure 9H:
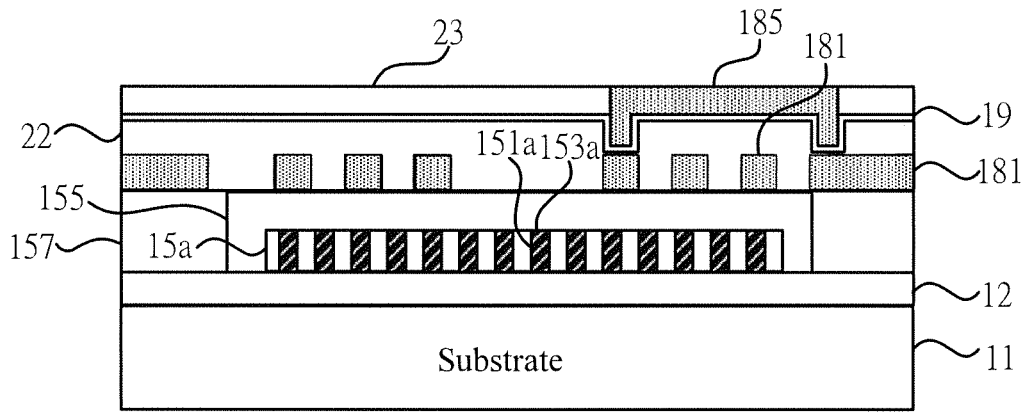
Figure 9I:
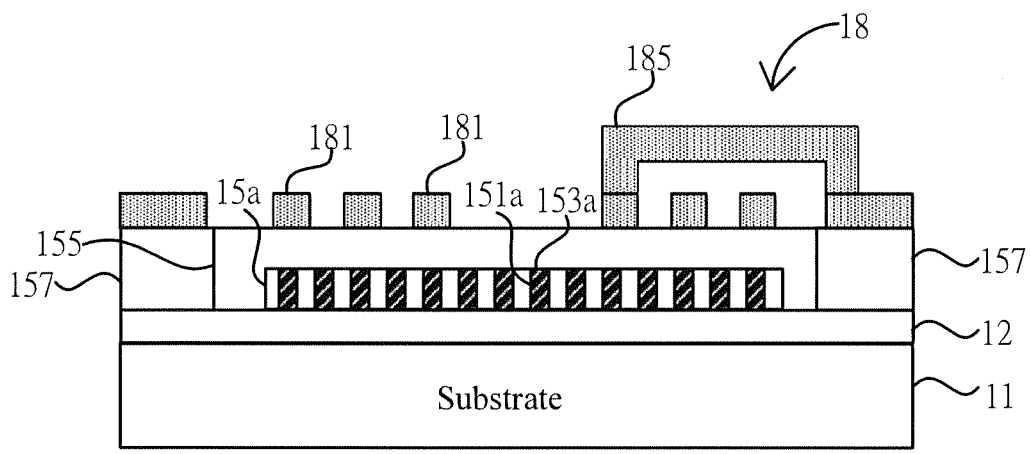

Next, the steps as shown in FIGS. 9G-9I are the same as the steps as shown in FIGS. 3F-3H, so steps as shown in FIGS. 9G-9I have described above steps as shown in FIGS. 3F-3H.

Figure 10:
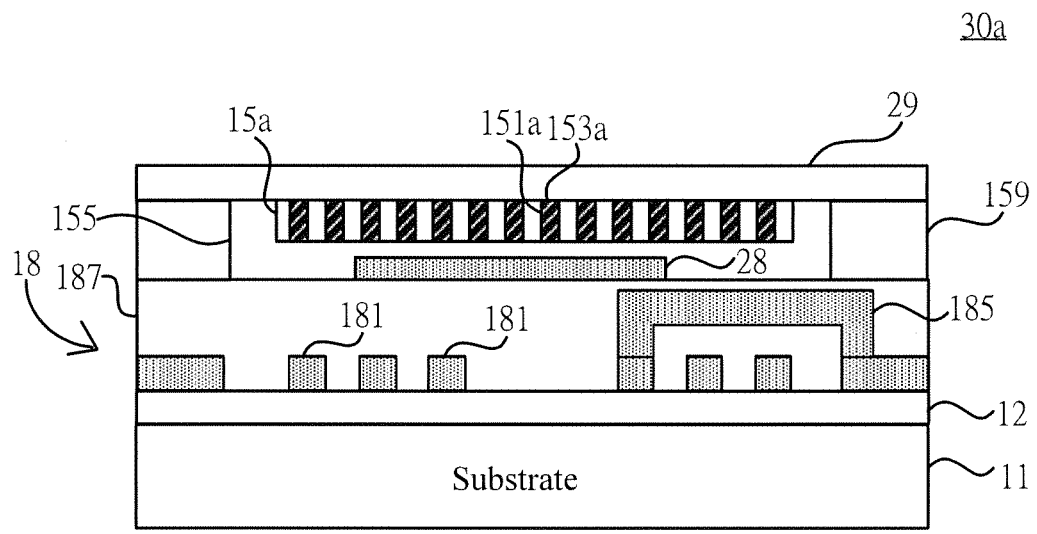
FIG. 10 shows a structure of the on-chip electronic device according to another preferred embodiment of the present invention.

FIG. 10 shows a structure of the on-chip electronic device according to another preferred embodiment of the present invention. The on-chip electronic device 30a shown in FIG. 10 is a resonator, and the on-chip electronic device 30a is similar to the on-chip electronic device 30. Therefore, the on-chip electronic device 30a also comprises the substrate 11, the first insulating layer 12, the porous layer 15a, the plurality of magnetic bodies 153a, the second insulating layer 16, and the electronic member layer 18.

The electronic member layer 18 is disposed on the substrate 11, and the first insulating layer 12 is disposed between the substrate 11 and the electronic member layer 18. The porous layer 15 according to this embodiment is also shorter than the substrate 11, and shorter than the electronic member layer 18. The porous layer 15a is disposed on the electronic member layer 18. It is noted that a metal layer 28 is further disposed between the porous layer 15a and the electronic member layer 18, and a chamber 155 is also disposed between the porous layer 15a and the electronic member layer 18, wherein the metal layer 28 can set as a beam, an anchor or a bridge. A gap d is aligned between the porous layer 15a and the metal layer 28. Thereby, the metal layer 28 is oscillated while the on-chip electronic device is applied with power. Further, a spacer layer 159 is located on the electronic member layer 18 and disposed around the porous layer 15a and the metal layer 28. Furthermore, a holding layer 29 is disposed on the porous layer 15a and the spacers 159, and holding the porous layer 15a.

Figure 11A:
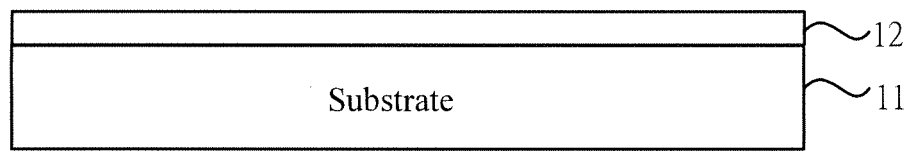
FIG. 11A to FIG. 11J show structural schematic diagrams of the manufacturing process for the on-chip electronic device according to another preferred embodiment of the present invention.
Figure 11B:
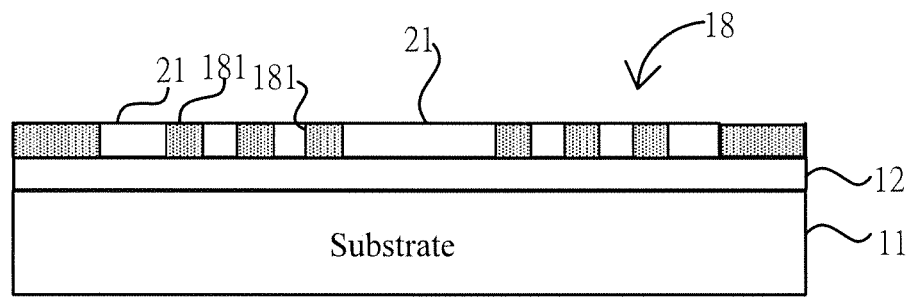
Figure 11C:
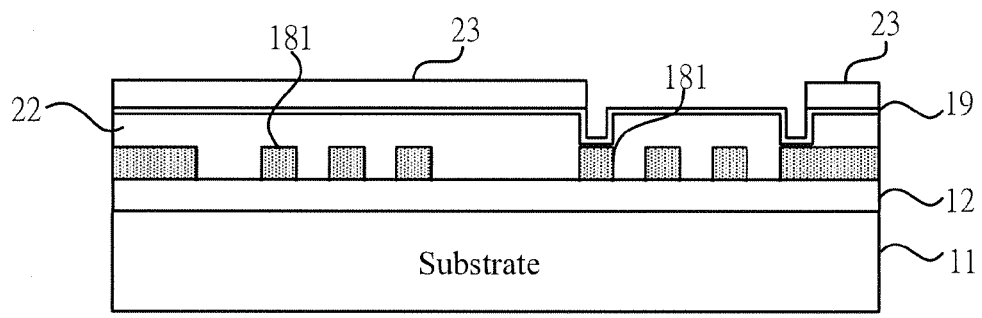
Figure 11D:
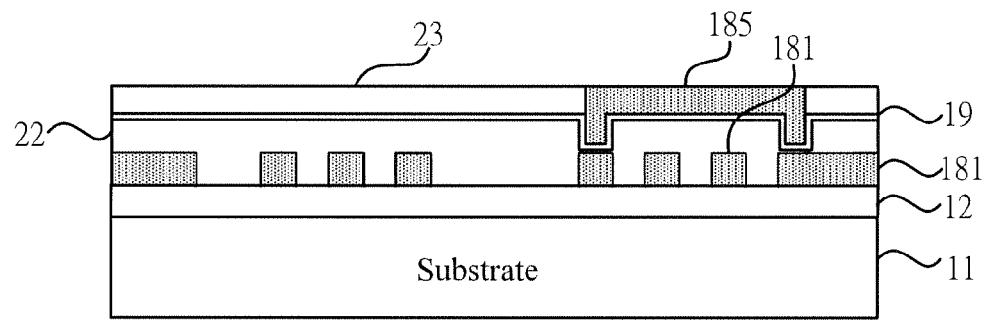

FIG. 11A to FIG. 11J show structural schematic diagrams of the manufacturing process for the on-chip electronic device according to another preferred embodiment of the present invention. Firstly, as shown in FIG. 11A, the substrate 11 is provided and the first insulation layer 12 is formed on the substrate 11. Next, as shown in FIG. 11B, the first photoresist layer 21 is formed on the first insulating layer 12 according to the desired pattern of the coils 181 of the electronic member layer 18 for masking part of the first insulating layer 12. Thereby, the electronic member layer 18 is disposed on the first insulating layer 12, so the electronic member layer 18 is also disposed on the first insulating layer 12. The steps as shown in FIGS. 11C-11D are the same as the steps as shown in the FIGS. 9G-9H, so the embodiment of the steps as shown in FIGS. 11C-11D are not repeated.

Figure 11E:
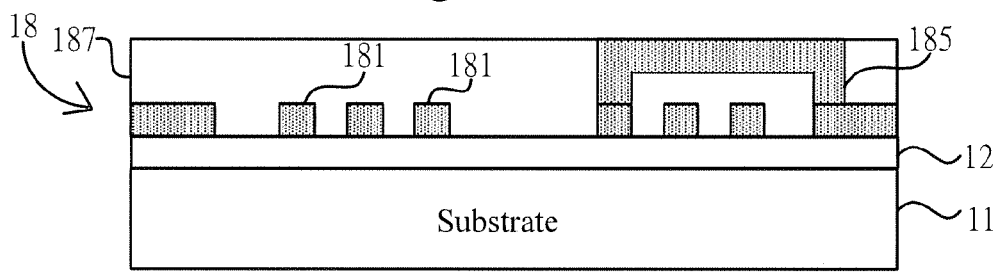
Figure 11F:
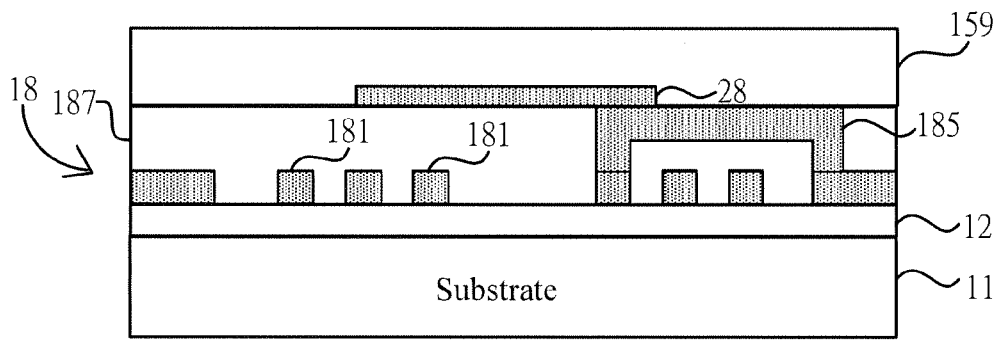
Figure 11G:
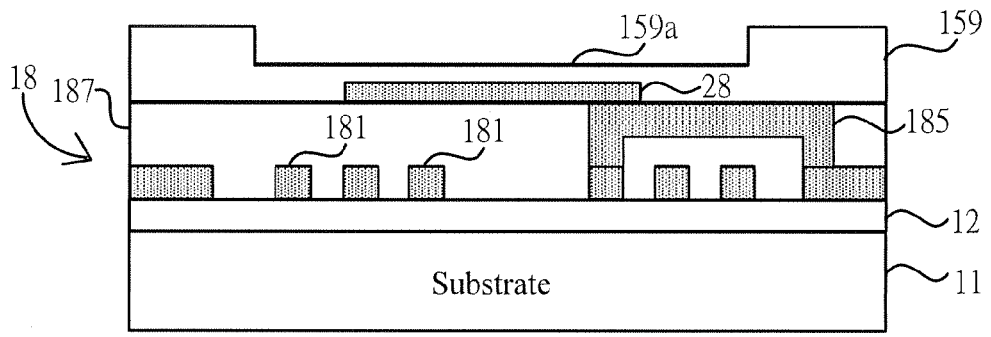
Figure 11H:
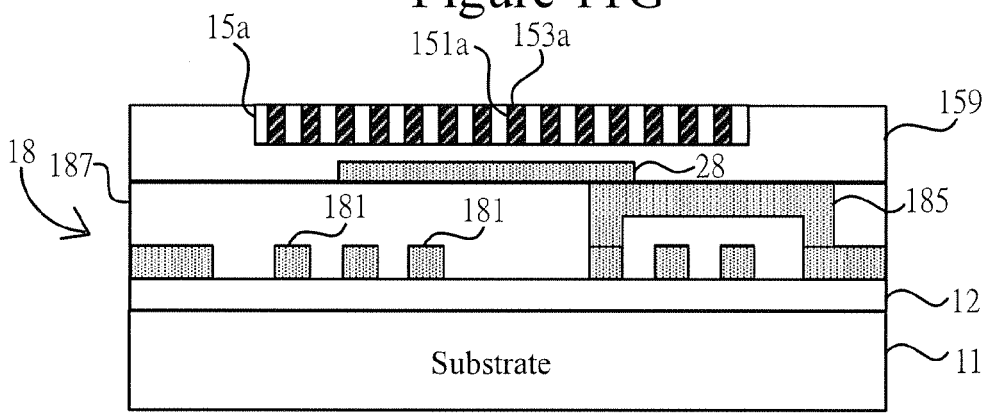
Figure 11I:
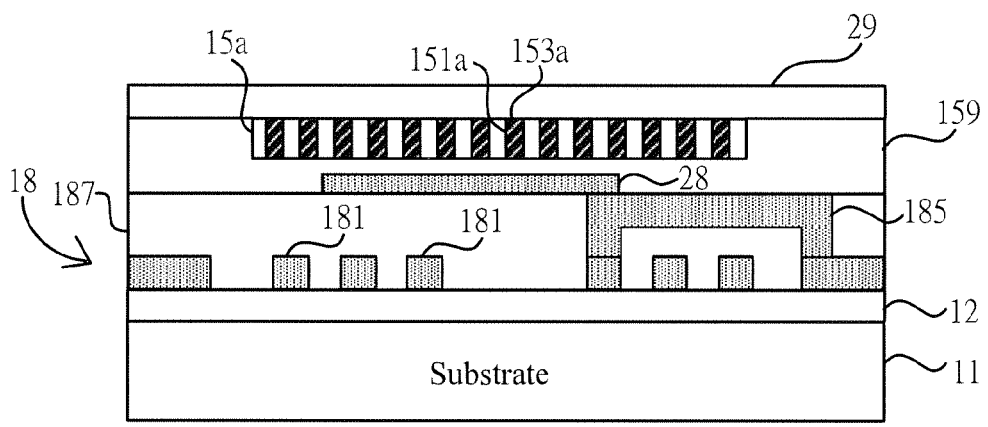
Figure 11J:
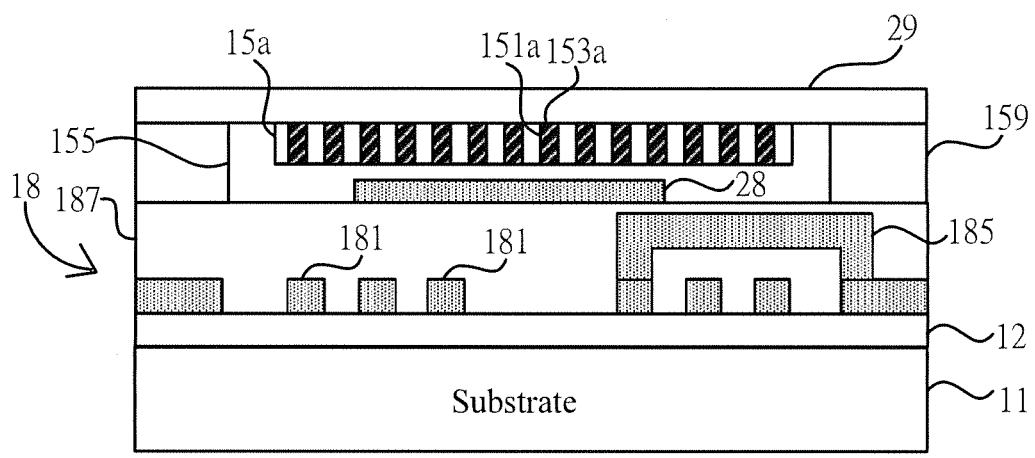

Next, as shown in FIG. 11E, the electronic member layer 18 is covered with a coil spacer layer 187 for flat and smooth. Then, a metal layer 28 is disposed on the electronic member layer 18, and the spacer layer 159 is formed on the electronic member layer 18 and the metal layer 28 as shown in FIG. 11F. As shown in FIG. 11G, a fillister 159a is formed on the coil spacer layer 159 for forming the porous layer 15a as shown in FIG. 11H. Then, as shown in FIG. 11H, the porous layer 15a with the plurality of voids 151 are formed in the fillister 159a, and the magnetic bodies are filled in the voids respectively. Therefore, the porous layer 15a is disposed on the upper side of the electronic member layer 18. Next, as shown in FIG. 11I, the holding layer 29 is disposed on the porous layer 15a and the spacer layer 159, so the porous layer 15a is disposed between the electronic member layer 18 and the holding layer 29. As shown in 11J, the chamber 155 is formed in the spacer layer 159, so the chamber 155 is disposed between the porous layer 15a and the electronic member layer 18. Thus, the on-chip electronic device 30a performed as the resonator is completed.

Figure 12:
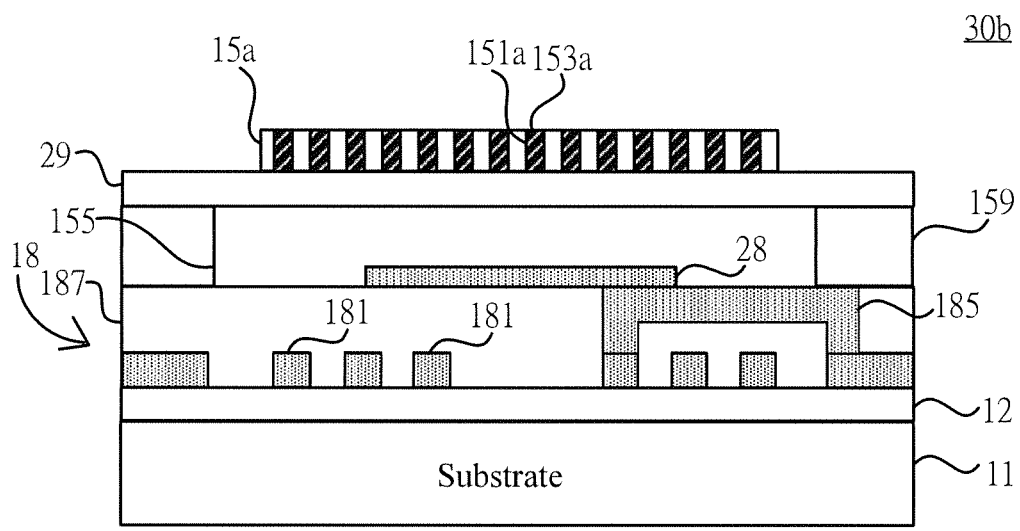
FIG. 12 shows a structure of the on-chip electronic device according to another preferred embodiment of the present invention.

FIG. 12 shows a structure of the on-chip electronic device according to another preferred embodiment of the present invention. The on-chip electronic device 30b shown in FIG. 12 is a resonator, and is similar to the on-chip electronic device 30a shown in FIG. 10. Therefore, the on-chip electronic device 30b also comprises the substrate 11, the first insulating layer 12, the porous layer 15a, the plurality of magnetic bodies 153a, the second insulating layer 16, and the electronic member layer 18.

The electronic member layer 18 is disposed on the substrate 11, and the first insulating layer 12 is disposed between the substrate 11 and the electronic member layer 18. The spacer layer 159 is located on the electronic member layer 18. The metal layer 28 is disposed on the electronic member layer 18, and the holding layer 29 is disposed on the metal layer 28 and the spacer layer 159. The porous layer 15a is disposed on the holding layer 29. The chamber 155 is disposed between the metal layer 28 and the holding layer 29, that means the chamber 155 is also disposed between the porous layer 15a and the electronic member layer 18 while the metal layer 28 is disposed on the electronic member layer 18 and the porous layer 15a is disposed on the holding layer 29. Further, the spacer layer 159 are disposed around the porous layer 15a.

To sum up, the on-chip electronic device according to the present invention comprises a substrate, a porous layer, a plurality of magnetic bodies, and a electronic member layer. The manufacturing method according to the present invention comprises providing a substrate, forming a porous layer with a plurality of voids on the substrate, forming a plurality of magnetic bodies isolated from each other in the plurality of voids, and forming an inductor on the porous layer. Because the plurality of magnetic bodies is used as the core of the electronic member layer, the inductance of the on-chip electronic device is increased effectively and still increases at high frequencies. Such on-chip electronic device according to the present invention can be performed as an on-chip inductor or an on-chip resonator. Thereby, the area occupied by the on-chip electronic device is reduced effectively, which is beneficial for miniaturization. Besides, because the manufacturing method according to the present invention is compatible with the current CMOS process, the manufacturing cost can be lowered.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An on-chip electronic device, comprising: a substrate; a porous layer, disposed on said substrate, and having a plurality of nanometer voids; a plurality of magnetic bodies, disposed in said plurality of nanometer voids; and an electronic member layer, disposed on one side of said porous layer; wherein said electronic member layer is disposed on the lower sider of said porous layer, and further comprising a beam layer, disposed between said electronic member layer and said porous layer.

2. The on-chip electronic device of claim 1, wherein said electronic member layer is an inductor member layer or a resonator member layer.

3. The on-chip electronic device of claim 1, wherein said electronic member layer is disposed on the upper side of said porous layer, and further comprising:
a first insulation layer, disposed between said substrate and said porous layer; and
a second insulation layer, disposed between said porous layer and said electronic member layer.

4. The on-chip electronic device of claim 1, wherein said electronic member layer is disposed on the upper side of said porous layer, and further comprising a chamber disposed in said substrate.

5. The on-chip electronic device of claim 1, wherein said electronic member layer is disposed on the upper side of said porous layer, and further comprising a chamber disposed between said porous layer and said electronic member layer.

6. The on-chip electronic device of claim 1, wherein said metal coil disposed on the lower side of said porous layer, and further comprising:
a first insulation layer, disposed between said substrate and said electronic member layer; and
a second insulation layer, disposed between said electronic member layer and said porous layer.

7. The on-chip electronic device of claim 1, wherein said electronic member layer is disposed on the lower sider of said porous layer, and further comprising a chamber disposed between said electronic member layer and said porous layer.

8. The on-chip electronic device of claim 1, wherein said electronic member layer is disposed on the lower sider of said porous layer, and further comprising a beam layer disposed on the upper side of said electronic member layer.

9. The on-chip electronic device of claim 1, wherein the material of said plurality of magnetic bodies is a conductive material or a non-conductive material.

10. The on-chip electronic device of claim 1, wherein said magnetic bodies are pillar shaped.

11. The on-chip electronic device of claim 1, wherein the depth-to-width ratio of said magnetic bodies is greater than 3:1.

* * * * *